United States Patent
Spinar et al.

(10) Patent No.: US 8,826,754 B2
(45) Date of Patent: Sep. 9, 2014

(54) MODULAR PROBE ASSEMBLY HAVING FORCE PROTECTION AND ARTICULATION

(75) Inventors: James E. Spinar, Clackamas, OR (US); Kyle A. Grist, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 43 days.

(21) Appl. No.: 13/593,684

(22) Filed: Aug. 24, 2012

(65) Prior Publication Data

US 2014/0053667 A1   Feb. 27, 2014

(51) Int. Cl.
*G01D 11/30* (2006.01)
*G01D 21/00* (2006.01)
*G01R 1/067* (2006.01)
*G01D 11/24* (2006.01)

(52) U.S. Cl.
CPC ............ *G01D 11/24* (2013.01); *G01R 1/06788* (2013.01); *G01D 11/30* (2013.01)
USPC ....................................................... 73/866.5

(58) Field of Classification Search
USPC ....................................................... 73/866.5
See application file for complete search history.

(56) References Cited

U.S. PATENT DOCUMENTS

| | | | |
|---|---|---|---|
| 4,209,742 A | 6/1980 | Bender et al. | |
| 6,186,959 B1* | 2/2001 | Canfield et al. | 600/559 |
| 6,466,000 B1 | 10/2002 | Nightingale | |
| 6,731,104 B1 | 5/2004 | Yang | |
| 7,126,360 B1 | 10/2006 | Yang | |
| 7,592,822 B2 | 9/2009 | Reed et al. | |
| 2008/0039709 A1* | 2/2008 | Karmarkar | 600/410 |
| 2008/0052028 A1* | 2/2008 | Pickerd et al. | 702/109 |

* cited by examiner

*Primary Examiner* — Lisa Caputo
*Assistant Examiner* — Jamel Williams
(74) *Attorney, Agent, or Firm* — Marger Johnson & McCollom PC; William K. Bucher

(57) ABSTRACT

A modular probe assembly for a signal processing instrument has an elongate member extending from a first module of the probe assembly and a cavity recessed in a second module of the probe assembly. The cavity of the second module is structured to receive the elongate member of the first module. A module for the probe assembly may have a first articulating elongate member disposed at an end of a housing of the module. The elongate member extending from a first module of the probe assembly may be inserted into a cavity recessed in a second module, and the first module may be removably joined to the second module.

18 Claims, 7 Drawing Sheets

MODULAR PROBE ASSEMBLY HAVING FORCE PROTECTION AND ARTICULATION

BACKGROUND

Electronic devices commonly used today would not be possible without the use of sophisticated measurement instruments to engineer them. Among the types of measurement devices commonly found in engineering labs are oscilloscopes, logic analyzers, and other types of signal processing instruments. These devices reveal to an engineer the wave patterns that an electronic signal may take when generated within a component of a device under study. Understanding these wave patterns helps an engineer to understand whether the device is behaving as expected.

Hand-held probes are typically connected to these instruments with a cable. Touching a probe to portions of a device under test allows an engineer to browse signals as displayed by the view port of the instrument. As electronic devices have become smaller and the frequency signals generated within them has increased, so has the demand for probes with greater sensitivity. Consequently, sensitive probes are increasingly more delicate and easy to damage when mishandled. This may be especially worrisome to owners of a lab, as probes are a nontrivial expense.

There is a need in the market for a hand-held probe that can inoculate itself from the damage that may be inadvertently inflicted upon it by an engineer or technician. Increasingly, probes may accommodate a variety of tips, suited for different measurement purposes. It would be ideal if a self-protection mechanism could be applied to the variety of tips that may be attached to the probe.

One solution to the problem of exposing a probe to the risk of damage when handled is to attach the probe to a probe stand, also known as a probe manipulator. While affixed to the stand, the probe remains relatively safe. Nonetheless, the probe is still exposed to the risk of damage in the process of affixing it to the stand, as any reliance on an opposable thumb is fraught with peril. Moreover, adjustments to a probe stand can be coarse and may not position the probe according to the desire of the engineer. An engineer who is dissatisfied with the ability of the stand to properly position the probe may cast it aside and rely on hand-held positioning, which again, is a risky enterprise. Thus, a need in the market surfaces for a probe that may be affixed to a probe stand whose position in relation to the device under test may be refined once the coarse adjustments of the stand are made.

A further need in the market would be satisfied by the combination of a probe protection mechanism and a position refinement mechanism. It would be ideal if these two solutions could be combined arbitrarily in a modular fashion. This gives rise to another need, a modular system that would facilitate an arbitrary order between probe modules that have disparate functions.

SUMMARY

It is, therefore, an object of the invention to satisfy the need for a probe protection mechanism with a protection module that may be removably attached to a probe. Another object of the invention is to satisfy the need for a position refinement mechanism with an articulation module that may be removably attached to a probe. A further object of the invention is to satisfy the need for a modular system of combining the aforementioned modules in an arbitrary order with a standardized interconnect.

The foregoing and other objects, features and advantages of the invention will become more readily apparent from the following detailed description of a preferred embodiment of the invention which proceeds with reference to the accompanying drawings.

DETAILED DESCRIPTION

Figure 1:
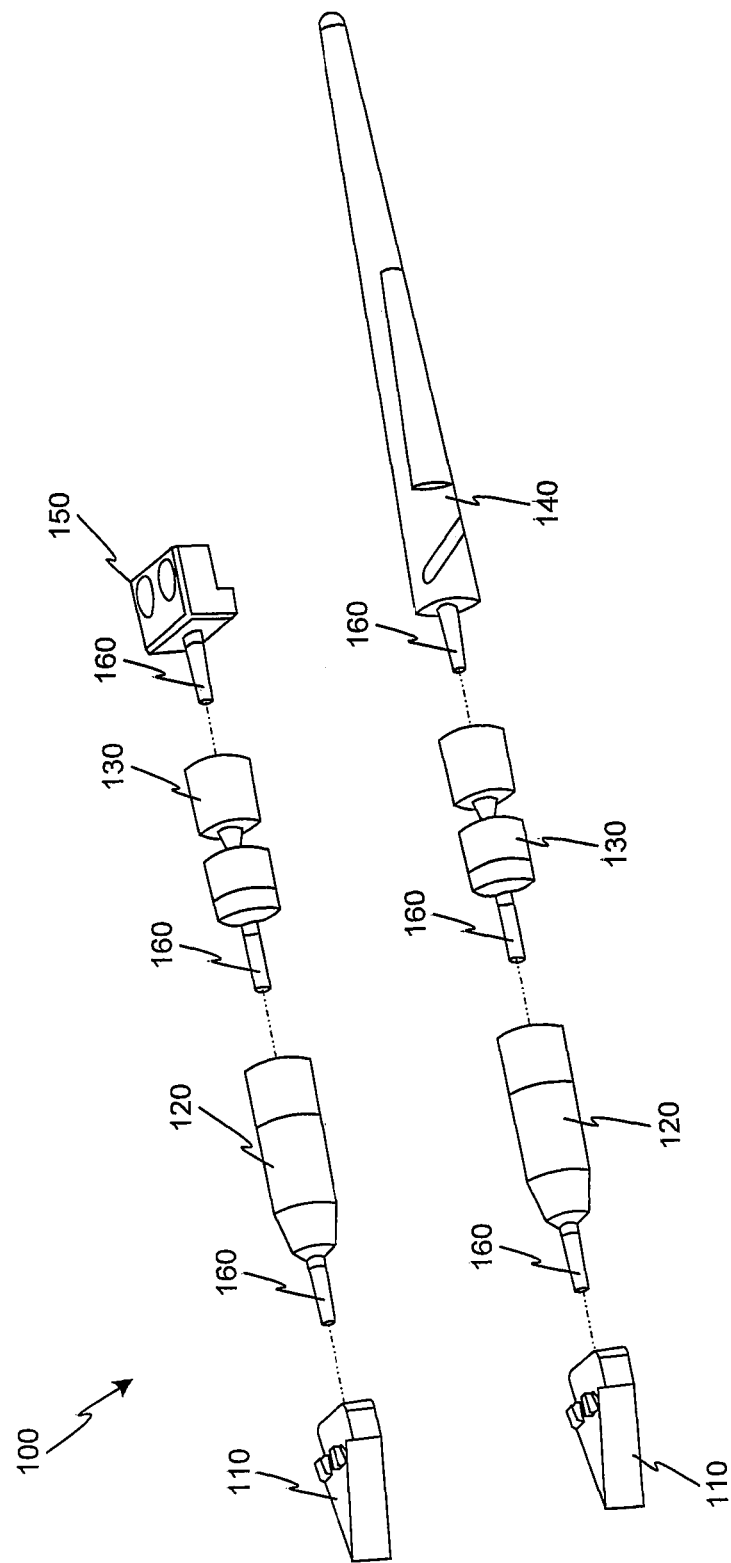
FIG. 1 is an exemplary perspective view of a modular probe assembly with a probe tip module, a protection module, an articulation module, a module for attachment to a probe manipulator, and a handle module.

FIG. 1 depicts an embodiment of a modular probe assembly 100 for a signal processing instrument (not shown). In this embodiment, the modules may be selected from the following: (1) a probe tip module 110; (2) a protection module 120; (3) an articulation module 130; (4) a handle module 140; (5) and a module for attachment to a probe manipulator 150. In FIG. 1, two configurations of the assembly are apparent. In the first, a probe tip module 110 may be attached to a protection module 120, which may be attached to an articulation module 130, and this may also be attached to a probe manipulator module 150. Similarly, FIG. 1 shows a second configuration with a handle module 140 connecting to an articulation module 130, further connected to a protection module 120, which is terminated by a probe tip module 110.

The alignment, configuration, and selection of modules may be arbitrary. The necessary consideration is whether a module in the assembly possesses a tapered pin 160, a tapered cavity 170 (not shown in FIG. 1) to receive the pin 160, or both. If a module only possesses a pin 160 or a cavity 170, the module must function as a terminus of the assembly. If a module possesses both a pin 160 and a cavity 170 to receive an pin 160, it can assume any ordinal position relative to a terminus of the assembly. The dimensions of the pin 160 and cavity 170 remain standardized between the modules.

Figure 2:
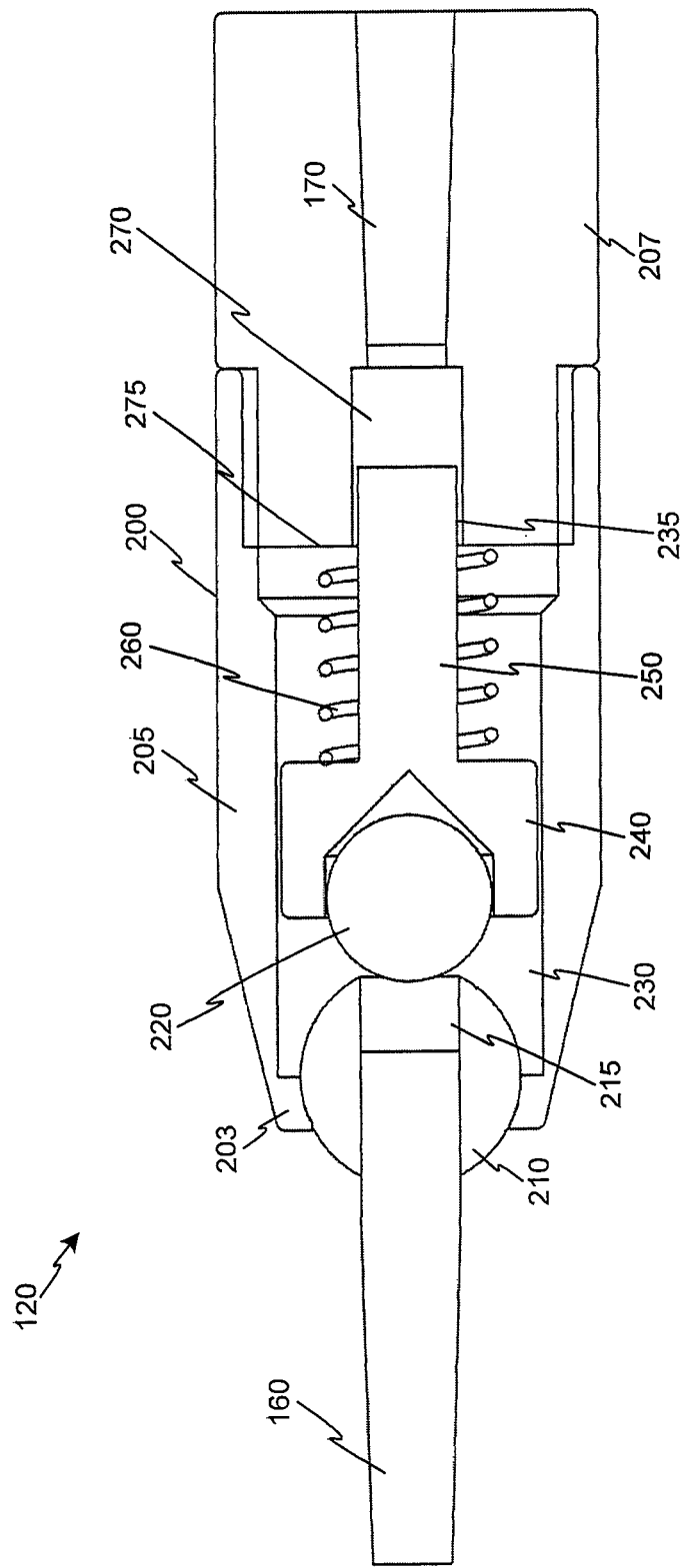
FIG. 2 is an exemplary sectional view of a protection module.
Figure 3:
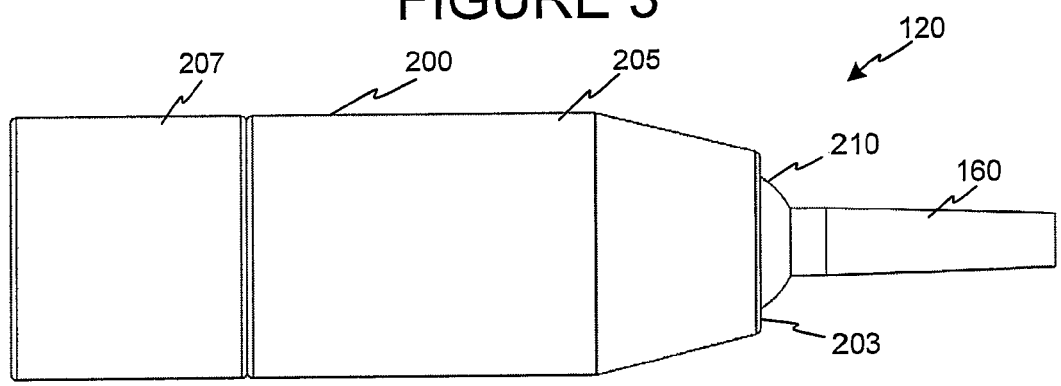
FIG. 3 is an exemplary side view of a protection module.
Figure 4:
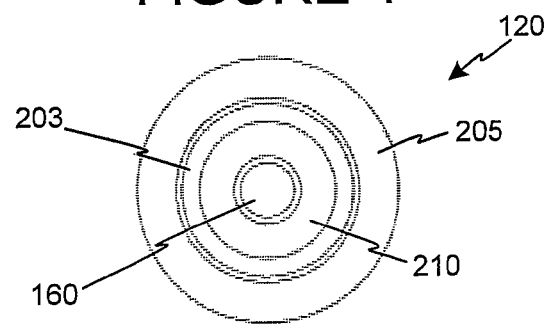
FIG. 4 is an exemplary front view of a protection module.
Figure 5:
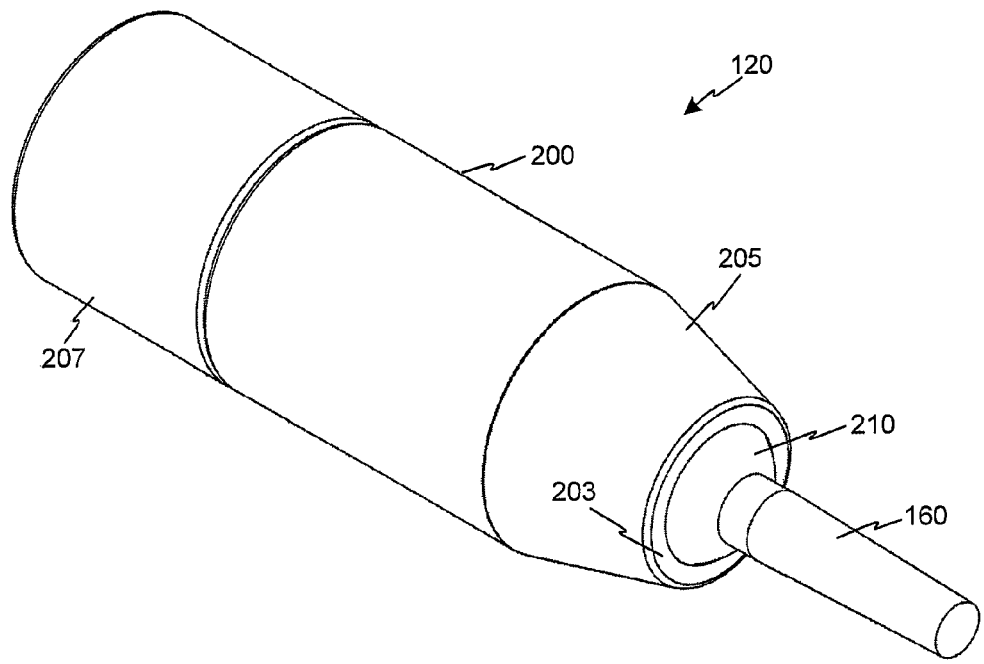
FIG. 5 is an exemplary perspective of a protection module.
Figure 6:
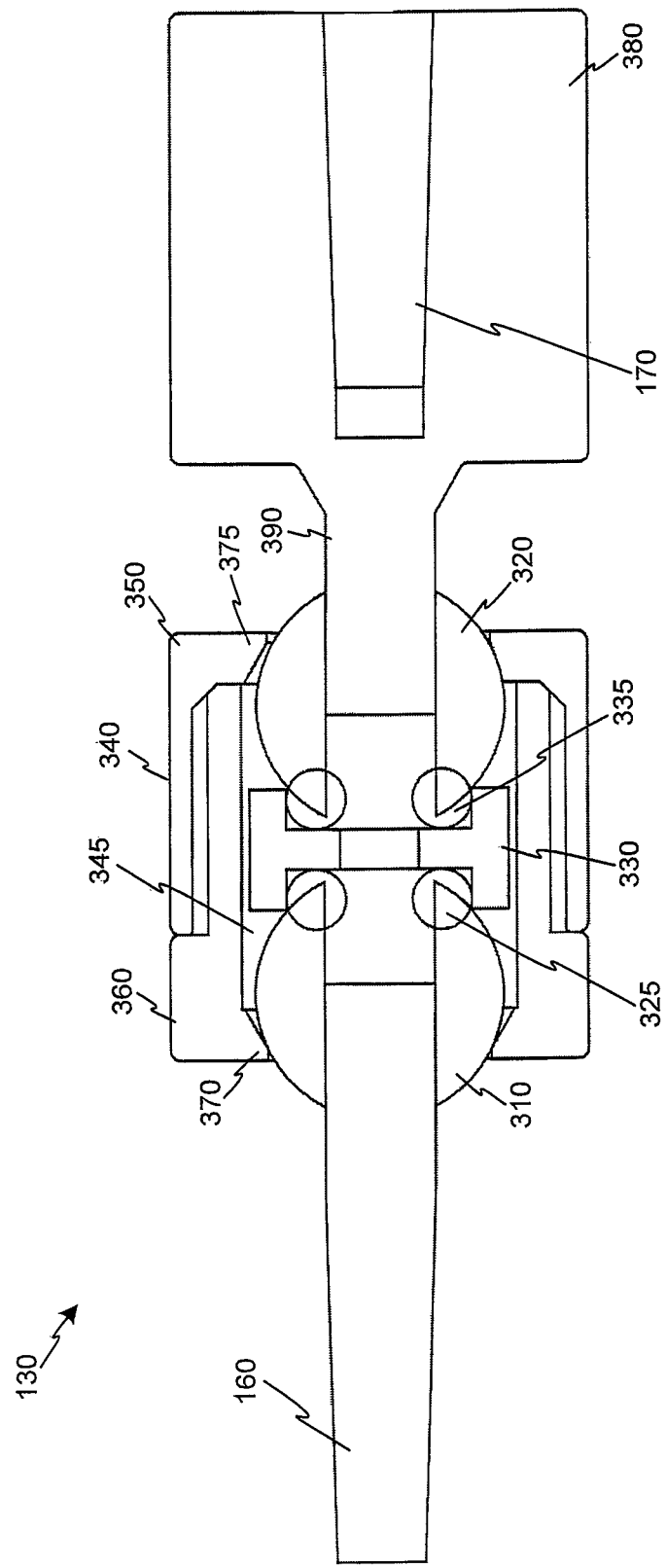
FIG. 6 is an exemplary sectional view of an articulation module.
Figure 7:
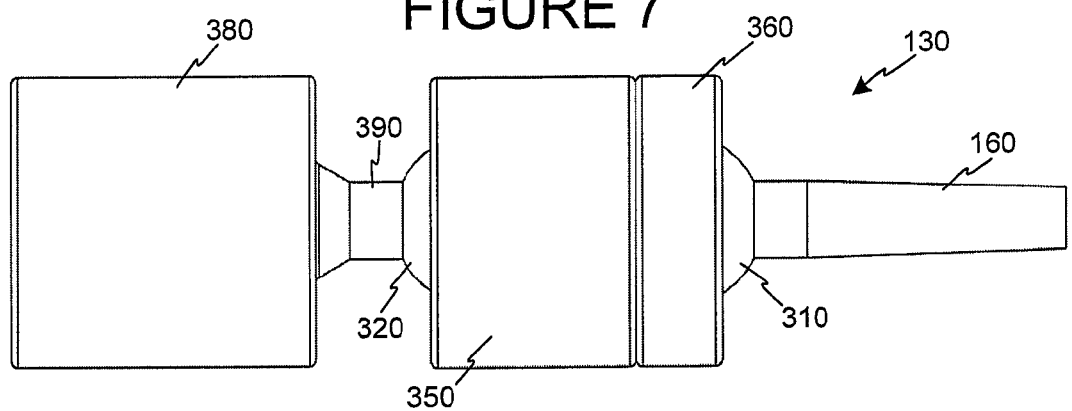
FIG. 7 is an exemplary side view of an articulation module.
Figure 8:
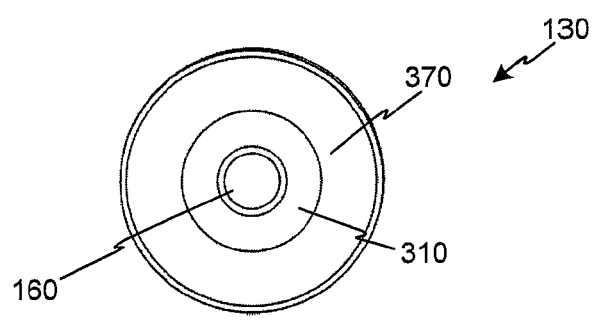
FIG. 8 is an exemplary front view of an articulation module.
Figure 9:
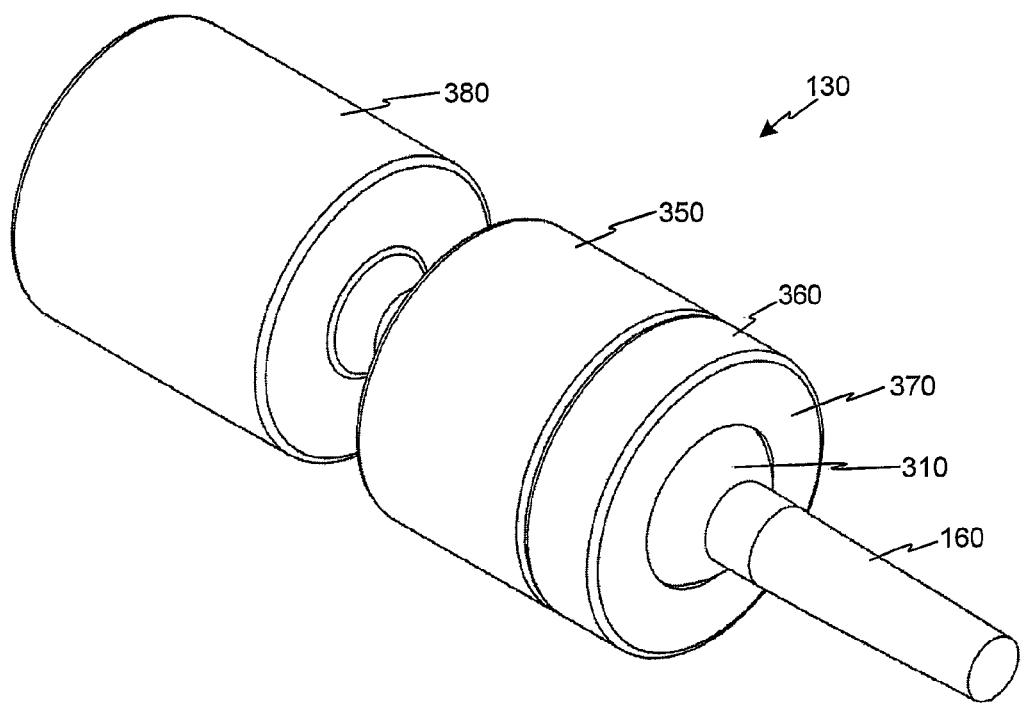
FIG. 9 is an exemplary perspective view of an articulation module.

FIG. 2 and FIG. 6 further illustrate an embodiment of the pin 160 and the cavity 170 to receive the pin 160. As shown in the sectional view of FIG. 2, the angle of taper for the pin 160 substantially matches the taper of the cavity 170. The dimensions of both the pin 160 and the cavity 170 are symbiotically paired to one another so as to facilitate a healthy seal between the two. This is to ensure that a maximum surface area of the pin 160 mates with a maxim surface area of the cavity 170.

An increase in the surface area of the pin 160 and the surface area of the cavity 170 increases frictional forces between the two when mated. Those ordinarily skilled in the art will recognize that a careful selection of materials constituting the surface of these two components may also enhance the coefficient of friction, and quality materials will strike a balance between the coefficients of static and kinetic friction. The coefficient of static friction will be large enough to maintain a bond between modules under normal operation of the probe assembly 100, yet not be so burdensome as to prevent the decoupling of modules without undue force. A coefficient of kinetic friction will be small enough to prevent excessive wear and tear on the pin 160 and cavity 170.

Although a pin 160 extends from the handle module 140 in FIG. 1, an alternate embodiment of the invention may reverse the orientation of pins 160 to cavities 170 such that the cavity 170 is recessed in the handle module 140, and the pin extends from the probe tip 110. The other modules of the probe assembly 100 in FIG. 1 will be structured to interconnect in a manner complimentary to the reversed orientation in the alternate embodiment. In such a system, the tactile feedback mechanism structured in protection module 120, as further illustrated in FIGS. 2-5 and described below, may be incorporated into the probe tip module 110. In this embodiment, the protection module 120 and the probe tip module 110 become a single module, sans cavity 170.

The modular system embodied in FIG. 1 is made possible by the standardization of the pin 160 and cavity 170 interconnection between modules. The standardized interconnect need not take the form of the tapered pin 160 and the tapered cavity 170 represented in FIGS. 2 and 6. Any elongate member and cavity structured to receive the elongate member will suffice so long as it is standardized across the several modules of the probe assembly 100. More broadly, a standardized coupling, regardless of whether it takes the form of elongate member and cavity, defines the modularity aspect of the embodiment in FIG. 1. Alternate embodiments of the probe assembly 100 may replace an elongate member and cavity with a different coupling structure.

FIGS. 2-5 depict an embodiment of the protection module 120 in greater detail. The pin 160 and cavity 170, as discussed above, are easily recognizable and are disposed in opposite relation to one another on the module. A first pivoting ball 210 is affixed to the base of the pin 160 and is restrained by a collar 200. The collar 203 is incorporated into the front cap 205 of the housing 200. Adjoined to the front cap 205 is the end cap 207, and the two caps form the housing 200 of the protection module 120.

The pin 160 articulates freely within a range of motion determined, in part, by the radius of the collar 203 and the manner in which it is seated against the first pivoting ball 210. A cylindrical cavity 215 in the first pivoting ball 210 is structured to receive a second pivoting ball 220. While the embodiment of FIG. 2 shows this as a cylindrical recess, an alternative embodiment may take the form of a dimple with adequate dimension to receive the second pivoting ball 220. When pressed into the cavity 215, the second pivoting ball 220 locks the first pivoting ball 210 in place. This, in turn, locks the pin 160 into a position that is coaxial with the housing 200 and prevents the pin 160 from articulating.

A plunger head 240 receives the second pivoting ball 220, and the plunger head 240 reciprocates within and coaxially to a first cylinder 230. The plunger head 240 and a plunger stem 250 together form the plunger 235. Reciprocation of the plunger 235 entails that, while the plunger head 240 reciprocates in the first cylinder 230, the plunger stem 250 likewise reciprocates in a second cylinder 270 recessed in the end cap 207. A spring 260 sheathes the plunger stem 250 and is loaded against the plunger head 240 and a rim 275 of the second cylinder 270. The loaded spring 260 presses the second pivoting ball 220 into the cavity 215 of the first pivoting ball 210. The cooperation of these components creates a spring-loaded locking mechanism.

The first pivoting ball 210 is braced, supported, or held steady by the presence of the second pivoting ball 220 in the first cylinder. In this respect, the second pivoting ball 220 may also be viewed as acting as a brake. When an incident force of sufficient magnitude is applied to the pin 160, the resulting torque will compress the spring 260 and allow the second pivoting ball 220 to escape from the cavity 215 of the first pivoting ball 210. For a user operating the protection module 120, the movement of the pin 160 and pivoting balls will generate a tactile feedback mechanism, or cue, that the incident force has exceeded an acceptable threshold. The articulation of the pin 160 also generates a visual cue that the threshold is exceeded. While the joint of the protection module 120 is articulated, compression of the spring 260 applies greater force to the second pivoting ball 220. Returning the pin 160 to its coaxial position restores the second pivoting ball 220 to the cavity 215 and releases a magnitude of pressure originating from the spring 260. This may result in another tactile sensation experienced by the user of the probe assembly 100, a cue that the protection module 120 is primed for reuse.

The visual and tactile cues serve to protect the arbitrary module connected to the protection module 120. In the embodiment shown in FIG. 1, this is a probe tip module 110, which may be especially sensitive to and potentially damaged by pressures applied to it with the human hand. The force required to articulate the pin 160, in an ideal embodiment, will not exceed forces that would damage the probe tip module 110. Nonetheless, the force required to articulate the pin 160 will be great enough to facilitate normal operation of the protection module 120 wherein the pin 160 remains coaxial to the housing 200. In alternate embodiments, the probe tip module 110 may be substituted for any another sensitive, arbitrary module that requires protection.

Other embodiments of the protection module 120 may replace the first pivoting ball 210 with a cylinder mounted on an axel. The axel allows the pin 160 to articulate, although with a more limited range of motion than is available with the pivoting ball 210. Another embodiment of the protection module 120 may eliminate the plunger stem 250 and the second cylinder 270. In such a configuration, the spring 260, or another spring-like material, may be loaded against the plunger head 240 and a base of the first cylinder 230. In yet another embodiment, the cavity 215, second pivoting ball 220, and plunger 235 may be replaced with a brake. The concavity of such a brake may mirror the curvature of the first pivoting ball 220 or a replacement cylinder mounted on an axel. The brake may also be pressed against the first pivoting ball 210 by a spring 260 or a spring-like material loaded against a base of the first cylinder 230. Likewise, the brake may replace the plunger head 240 of the plunger 235, yet still be affixed to the plunger stem 250.

FIGS. 6-9 further illustrate an exemplary articulation module 130. The tapered pin 160 and tapered cavity 170, mentioned above, are readily apparent in FIG. 6. Like the first pivoting ball 210 of the protection module 120, a first pivoting ball 310 is affixed to the base of the pin 160. The pin 160 articulates across a range of motion determined, in part, by the radius of a first collar 370 and the manner in which it is seated against the first pivoting ball 310. The embodiment of FIG. 6 shows the first collar 370 incorporated into the body of a front cap 360. The front cap 360 is coupled to an end cap 350, both forming a housing 340. Similar to the first collar 370, a second collar 375 incorporated into the body of the end cap 350 restrains a second pivoting ball 320. Like the pin 160 and first pivoting ball 310, the second pivoting ball 320 is affixed to the base of a rod 390. The rod 390 and second pivoting ball 320 articulate in a manner similar to the pin 160 and first pivoting ball 310. Contiguously adjoined to the rod 390 is a block 380 that contains the tapered cavity 170 mentioned above.

The front cap 360 and the end cap 350 may either be loosely or tightly coupled together in the preferred embodiment. A user of the probe assembly 100 performs a tightening action to ensure a tight coupling. This may be accomplished a number of ways. In one embodiment, threads guide the coupling of the front cap 360 to the end cap 350 when screwed. In another embodiment, the front cap 360 and end cap 350 may have complimentary tapering to accommodate a frictional coupling, similar in function to the frictional coupling of the tapered pin 160 and tapered cavity 170.

The embodiment of FIG. 6 illustrates a first O-ring 325 and a second O-ring 335 resting against a brake 330. When the front cap 360 and the end cap 350 are tightly coupled, the first collar 370 and second collar 375 restrain the first pivoting ball 310 and second pivoting ball 320 with opposing force. These opposing forces press the first O-ring 325 and the second O-ring 335 against the brake 330. This immobilizes the pin 160 and rod 390. When the front cap 360 and end cap 350 are loosely coupled, both the pin 160 and the rod 390 are free to articulate across their available ranges of motion. A user of the probe assembly 100 may articulate the resulting joint to a desired angle and then tightly couple the front cap 360 and end cap 350 so that the jointed angle remains static. The frictional forces of the coupling, along with the frictional forces associated with the mating of the brake 330 and O-rings 325 and 335, help to ensure that the joint is immobilized.

Other embodiments of the invention may eliminate the rod 390, second pivoting ball 320, and second O-ring 335. In this example, only the pin 160 articulates and moves freely across its range of motion when the front cap 360 is loosely coupled. This configuration would merge the end cap 350 into the block 380, and the brake 330 may also be eliminated in favor of a base of the columnar articulation well 345. In this case, the base of the columnar articulation well 345 functions as a brake in a manner similar to that of brake 330. This embodiment is not preferred over the prior embodiment disclosed above, as the range of articulation for the entire articulation module 130 is more limited.

Yet another embodiment of the invention may eliminate the O-rings 325 and 335. The pivoting balls 310 and 320 will be uniformly spherical except where the pin 160 and rod 390 are affixed to the pivoting balls 310 and 320. The brake 330 may have a concavity that is complimentary to the curvature of the pivoting balls 310 and 320, sans O-rings 325 and 335. Another variation on this theme may eliminate the brake 330, and in such a configuration, the pivoting balls 325 and 335 may abut one another directly. In this configuration, one pivoting ball serves as a brake, in a more broad sense of the term, for the other. Either with an altered brake 330 or without a brake 330, the new configuration would be selected with materials that have a static coefficient of friction sufficient to immobilize the pivoting balls under normal operation of the probe assembly 100.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A modular probe assembly for a signal processing instrument, the modular probe assembly comprising:
   an elongate member extending from a first module of the probe assembly; and
   a cavity recessed in a second module of the probe assembly, the cavity structured to receive the elongate member of the first module, wherein a material comprising a surface of the cavity and a material comprising a surface of the elongate member together possess a friction coefficient that preserves a mating of the two modules under normal operation of the probe assembly.

2. The probe assembly of claim 1, wherein the elongate member and the cavity are tapered.

3. The probe assembly of claim 1, wherein at least one of the modules of the probe assembly is a handle module, a protection module, an articulation module, a probe tip module, or a module for attachment to a probe manipulator.

4. The probe assembly of claim 1, wherein the cavity is recessed in and the elongate member extends from a single module.

5. The probe assembly of claim 1, wherein the first module further comprises a recessed cavity, structured to receive an elongate member extending from a third module.

6. A module for a probe assembly, the assembly to be used with a signal processing instrument, comprising a first articulating elongate member disposed at an end of a housing of the module.

7. The module of claim 6, wherein a joint of the articulating elongate member is braced against a brake.

8. The module of claim 7, wherein the brake is pressed against the joint by a spring.

9. The module of claim 7, further comprising a first pivoting ball disposed on a base of the first elongate member, the first pivoting ball restrained by a first collar located at an end of the housing.

10. The module of claim 9, further comprised of a tapered cavity located in opposite relation to the elongate member, wherein the elongate member is also tapered.

11. The module of claim 10, further comprised of a cavity recessed in the first pivoting ball, the cavity receiving a portion of a second pivoting ball, and upon pivoting, the second pivoting ball escapes the cavity of the first pivoting ball.

12. The module of claim 11, wherein another portion of the second pivoting ball is nested in a head of a plunger, a first cylinder receives the plunger head, and the plunger reciprocates coaxially with the first cylinder.

13. The module of claim 12, wherein a spring sheathes a stem of the plunger, the spring is loaded against the plunger head and a rim of a second cylinder, the second cylinder receives the plunger stem, and the plunger reciprocates coaxially with the second cylinder.

14. The module of claim 9, wherein the first collar is incorporated into a forward cap, the forward cap is coupled to an end cap, and the first pivoting ball is braced against a brake when the forward cap and end cap are tightly coupled.

15. The module of claim 14, wherein a second collar is incorporated into the end cap, a second pivoting ball is restrained by the second collar, the second pivoting ball is disposed on a base of a second elongate member, and the second pivoting ball is braced against the brake when the forward cap and end cap are tightened.

16. The module of claim 15, wherein a first O-ring is disposed on the first pivoting ball in opposite relation to the first elongate member, a second O-ring is disposed on the second pivoting ball in opposite relation to the second elongate member, and the first and second O-rings are braced against the brake when the forward cap and end cap are tightened.

17. A method of using a module of a probe assembly for a signal processing instrument, the method comprising:

inserting an elongate member extending from a first module of the probe assembly into a cavity recessed in a second module of the probe assembly, the cavity structured to receive the elongate member of the first module;

removably joining the first module to the second module;

applying a force to the elongate member of the first module at an angle incident to an axis of the elongate member; and receiving a tactile cue from the first member that the force exceeds an acceptable threshold.

18. A method of using a module of a probe assembly for a signal processing instrument, the method comprising:

inserting an elongate member extending from a first module of the probe assembly into a cavity recessed in a second module of the probe assembly, the cavity structured to receive the elongate member of the first module;

removably joining the first module to the second module;

adjusting an angle of incidence of the elongate member, the elongate member articulated with a housing of the module; and immobilizing the elongate member at the adjusted angle.

* * * * *